United States Patent [19]

Hartman et al.

[11] 4,127,932
[45] Dec. 5, 1978

[54] METHOD OF FABRICATING SILICON PHOTODIODES

[75] Inventors: Adrian R. Hartman, Westfield, N.J.; Hans Melchior, Pfaffhausen, Switzerland; David P. Schinke, Berkeley Heights; Richard G. Smith, Basking Ridge, both of N.J.

[73] Assignee: Bell Telephone Laboratories, Incorporated, Murray Hill, N.J.

[21] Appl. No.: 793,493

[22] Filed: May 4, 1977

Related U.S. Application Data

[63] Continuation-in-part of Ser. No. 712,392, Aug. 6, 1976, abandoned.

[51] Int. Cl.$^2$ .............................................. B01J 17/00
[52] U.S. Cl. ........................................ 29/590; 148/187; 148/189; 357/13; 357/54; 357/58
[58] Field of Search .................. 29/590; 148/187, 189; 357/13, 52, 54, 58

[56] References Cited

U.S. PATENT DOCUMENTS

| | | | |
|---|---|---|---|
| 3,534,231 | 10/1970 | Biard | 357/13 |
| 3,617,398 | 11/1971 | Bilous | 357/58 |
| 3,728,593 | 4/1973 | Coleman | 357/58 |
| 3,886,579 | 5/1975 | Ohuchi | 357/13 |

*Primary Examiner*—W. Tupman
*Attorney, Agent, or Firm*—Michael J. Urbano

[57] ABSTRACT

Described is a method of fabricating front-illuminated silicon photodiodes having high quantum efficiency, a short response time, (high gain and low excess noise in the case of avalanche diodes), low dark currents and good reliability. In the fabrication of an $n^+$-p-$\pi$-$p^+$ APD the method includes the steps of: (1) epitaxially growing a high resistivity $\pi$-type silicon layer on a high conductivity p-type silicon substrate; (2) forming an n-type guard ring in the $\pi$-layer; (3) forming a p-type channel stop around the guard ring; (4) forming in the $\pi$-layer a p-layer by ion implantation and by driving in the implanted ions by heating in a suitable atmosphere; (5) masking the p-layer and introducing phosphorus into the backside to getter defects and/or impurities; (6) ramping the furnace temperature during steps (2) through (5) to reduce crystalline defects; (7) forming a thin $n^+$-layer in the p-layer; (8) forming an anti-reflection and passivation coating on the $n^+$-layer; and (9) forming electrical contacts to the substrate, the guard ring and the channel stop so that the latter two contacts overlap the surface portions of the corresponding metallurgical junctions. The $n^+$-layer is made extremely thin in order to reduce hole injection caused by light incident on that layer, and the ion implantation-drive step (4) and subsequent steps which involve heating are mutually adapted so that the resultant electric field profile in the multiplication region (p-layer) is substantially triangular. A similar process, which omits step (4), is also described for the fabrication of $n^+$-$\pi$-$p^+$ photodiodes.

20 Claims, 3 Drawing Figures

METHOD OF FABRICATING SILICON PHOTODIODES

CROSS REFERENCE TO RELATED APPLICATION

This application is a Continuation-in-Part of our copending application, Ser. No. 712,392, filed Aug. 6, 1976, now abandoned.

BACKGROUND OF THE INVENTION

This invention relates to photodiodes and, more particularly, to a method of fabricating $n^+$-p-$\pi$-$p^+$ silicon avalanche photodiodes or $n^+$-$\pi$-$p^+$ silicon photodiodes of the p-i-n type.

The advent of the laser and its promise as a carrier source for optical communications has stimulated widespread interest in the development of photodetectors with high sensitivity to weak signals and fast response to light intensity modulations. An optical receiver, which usually includes a photodetector and an amplifier at its output, should satisfy certain general performance criteria according to H. Melchior, *J. of Luminescence*, Vol. 7, pp. 390–414 (1973): (1) large response (quantum efficiency) at the wavelength of the incident optical signal; (2) sufficient electrical bandwidth (i.e., speed of response) to accommodate the information bandwidth; and (3) minimum excess noise introduced by the detection and amplification process.

One common type of photodetector is the photodiode which contains as an essential element a depleted semiconductor region with a high electric field that serves to separate electron-hole pairs photoexcited through band-to-band excitation. High speed photodiodes are usually connected to a relatively low impedance so as to allow the photoexcited carriers to induce a photocurrent in the load circuit while they are moving through the high field region. Photodiodes for detecting visible and near infrared radition are commonly operated at relatively large reverse bias voltages in order to reduce carrier drift time and lower the diode capacitance without introducing excessively large dark currents (Melchoir supra at 397). In a reversed biased p-i-n photodiode, for example, with radiation incident on the p-layer, the radiation which is not reflected at the surface penetrates some distance into the photodiode material before it is absorbed and generates photocarriers. Electrons and holes generated within the high field region of the junction (i-layer), and minority carriers which diffuse from the p- and n-layers to the junction before recombination, are collected across the high field region and contribute to the photocurrent.

The actual quantum efficiency and speed of response of photodiodes depends strongly on the wavelength of operation and the diode material and design. Silicon photodiodes, for instance, are preferably used in the near ultraviolet and in the infrared up to about 1 $\mu$m. But, because of its strongly varying light penetration depth, silicon photodiodes have to be optimized for each wavelength of interest (Melchior supra at 400). The speed of response is reduced at the longer wavelengths as the width of the high field region increases.

Dark currents in photodiodes limit the sensitivity to weak light signals and can originate either from the bulk or from the surface. Surface leakage currents, which are a problem especially in high resistivity silicon photodiodes, can be reduced by special surface treatments and various guard ring structures. On the other hand, bulk leakage currents in silicon photodiodes are mainly due to carrier generation within the space charge layer. For carefully processed silicon diodes dark currents as low as $10^{-6}$–$10^{-8}$ A/mm$^3$ of depleted volume have been attained (Melchior supra at 405).

One particularly useful type of photodiode is the avalanche photodiode (APD) which combines the detection of optical signals with internal amplification of the photocurrent. Internal current gain takes place in an APD when carriers gain sufficient energy by moving through a high field region of a highly reverse biased junction to release new electron-hole pairs via the mechanism of impact ionization. The current gain of an APD fluctuates due to the statistical nature of the carrier multiplication process. Even for spatially uniform avalanche regions the statistical gain variations give rise to noise in excess of multiplied shot noise and is usually characterized in terms of an excess noise factor given by:

$$F(M) = \frac{<i_M^2>}{<i_{ph}^2> \times M^2}, \quad (1)$$

where $<i_M^2>$ is the mean square noise current at the output of the APD divided by the mean square noise $<i_{ph}^2>$ of the primary photocurrent multiplied by the square of the average gain M. In a silicon APD the ionization rate $\alpha$ of electrons is much larger than the ionization rate $\beta$ for holes (e.g., $\beta/\alpha = 0.02$ to 0.2) and, as a consequence, F(M) increases much more rapidly for hole injection than for electron injection (Melchior supra at 409). This consideration suggests that a silicon $n^+$-p-$\pi$-$p^+$ *APD be back illuminated (i.e., light made incident on the $p^+$-layer* remote from the junction so that electrons are injected into the multiplication region) rather than front illuminated (i.e., light made incident on an $n^+$-layer near the junction so that holes are also injected into the multiplication region). H. W. Ruegg illustrates the application of this principle in the design of an $n^+$-$p$-$\pi$-$p^+$ silicon APD described in *IEEE Transactions on Electron Devices*, Vol. ED-14, No. 5, pp. 239–251 (1967). In this type of APD, which is particularly useful for high speed detection at GaAs laser wavelengths, carrier multiplication is constrained to the narrow $n^+$-p region and the wider $\pi$-region acts mainly as a collector for photoexcited electrons generated by light made incident on the $p^+$-layer. Ruegg (at 247, column 1) points out that "the optimized device requires the illuminated surface [the $p^+$-layer] to be opposite to the p-$n^+$ junction in order to assure pure electron injection into the multiplication region." Consequently, he requires that the "total device thickness in this case must be of the order of the penetration depth of the light to be detected" (20–30 $\mu$m for GaAs laser wavelengths). He goes on to add that "[s]ince wafers of this thickness cannot be handled, the only obvious solution was to etch local cavities (at the sites of devices) into a considerably thicker silicon wafer." Unfortunately, the need to etch uniformly thick cavities, or equivalently to thin the substrate by lapping, increases substantially the cost of manufacturing this type of APD. Cost increases also result because the thinned wafers are difficult to handle, are easily broken, tend to warp making mask alignment difficult, and present difficulty in packaging.

One alternative, therefore, is to form the structure on a thick $p^+$ region and to use front-illumination through the $n^+$-layer so that the wafer does not have to be thinned. But, as mentioned previously, mixed hole and electron injection occurs with an attendant increase in noise. In prior art front-illuminated $n^+$-p-$\pi$-$p^+$ silicon APDs (e.g., U.S. Pat. No. 3,886,579 granted to Ohuchi et al. on May 27, 1975) the structures have not been optimized to reduce excess noise, to produce low leakage currents and to be reliable in the long term. It is questionable, therefore, whether such devices are useful in an optical communication system in which receiver sensitivity is typically −55 dBm (e.g., at a 0.825 μm wavelength and a 44.7 megabit/sec data rate). Naturally, then, one would like to reduce the noise penalty and dark currents in a reliable APD without employing unduly complex processing so that the generally lower cost and case of handling advantages of a front-illuminated APD can be exploited.

It is, therefore, a broad object of our invention to fabricate silicon photodiodes such as $n^+$-p$\pi$-$p^+$ APDs and $n^+$-$\pi$-$p^+$ type p-i-n diodes.

It is another object of our invention to fabricate such an APD which can be front-illuminated without paying an excessive noise penalty.

It is yet another object of our invention to fabricate such a front-illuminated APD which is relatively easy to handle during processing and which is relatively inexpensive to fabricate.

It is one more object of our invention to fabricate such an APD which has low excess noise.

It is still another object of our invention to fabricate such an APD or p-i-n photodiode which also has high quantum efficiency, a short response time, low dark currents, and good reliability.

It is another object of our invention to fabricate such a p-i-n photodiode which has low capacitance and can operate at low voltages.

SUMMARY OF THE INVENTION

These and other objects are accomplished in accordance with our invention, a method of fabricating a front-illuminated silicon photodiode comprising the steps of: (1) epitaxially growing a high resistivity $\pi$-type silicon layer on a low dislocation density, high conductivity p-type silicon substrate; (2) forming an n-type guard ring in the $\pi$-layer by phosphorus diffusion; (3) forming in the $\pi$-layer a p-type channel stop around the guard ring by boron diffusion; (4) introducing phosphorus into the backside of the substrate to getter defects and/or impurities; (5) ramping the furnace temperature during steps (2), (3), and (4) to reduce crystalline defects; (6) forming an $n^+$-layer in the $\pi$-layer; (7) forming an anti-reflection/passivation coating on at least the $n^+$-layer and the region between the guard ring and channel stop; and (8) forming electrical contacts to the substrate, the guard ring, and the channel stop so that the guard ring contact overlaps the surface portion of the $\pi$-n metallurgical junction and the channel stop contact overlaps the surface portion of the $\pi$-p metallurgical junction.

A specific embodiment relates to the fabrication of a front-illuminated $n^+$-p-$\pi$-$p^+$ silicon APD having high quantum efficiency (>90% at GaAs—AlGaAs laser wavelengths, e.g., 0.80–0.90 μm), short response times (e.g., 1ns), high gain (e.g., $M = 100$), low excess noise factor (e.g., $F(M) = 4$–$6$ at $M = 100$), low dark current (e.g., $10^{-11}$ A) and good reliability. In this embodiment the method includes the steps of: (1) epitaxially growing a high resistivity (>300 Ω-cm) $\pi$-type silicon layer about 30–60 μm thick on a high conductivity $p^+$-type silicon substrate. Using epitaxial growth procedures renders our process particularly suitable for batch processing of large diameter wafers (e.g., ≧ 3 inch diameter); (2) forming an n-type guard ring in the $\pi$-layer by a predeposition and diffusion of phosphorus; (3) forming a p-type channel stop around the guard ring by a predeposition and diffusion of boron; (4) implanting in the $\pi$-layer 30–150 keV boron ions at a dose of about 4–6 × $10^{12}$ cm$^{-2}$; (5) driving in the implanted boron ions by heating at about 1150°–1250° C. for 2–8 hours in a suitable atmosphere, thereby forming a p-layer about 2–12 μm thick; (6) masking the p-layer and introducing phosphorus into the backside (p-substrate) from a POCl$_3$ or other suitable source by heating at about 1000°–1100° C. for 30–60 minutes, thereby to getter defects and/or impurities; (7) ramping the furnace temperature during steps (2) through (6) to reduce crystalline defects; (8) forming in the p-layer a thin $n^+$-layer about 0.1–1.0 μm thick; (9) forming an antireflection and passivation coating comprising a thin layer of SiO$_2$ on the $n^+$-layer and a quarter wavelength thick layer of Si$_3$N$_4$ on the SiO$_2$; (10) after forming the SiO$_2$ but before forming the Si$_3$N$_4$, annealing at about 850°–950° C. for 10–30 minutes in 1–5% HCl, thereby to getter or trap mobile ion contamination in the SiO$_2$; (11) forming a high conductivity $p^{++}$-contact layer to the back of the $p^+$-substrate; and (12) forming electrical contacts to the substrate, the guard ring and the channel stop so that the guard ring contact overlaps the surface portion of the $\pi$-n metallurgical junction and the channel stop contact overlaps the surface portion of the $\pi$-p metallurgical junction.

In addition, it is a feature of our APD process that the $n^+$-layer is made extremely thin in order to reduce hole injection, and hence excess noise, caused by radiation made incident on that layer. Even though this layer is extremely thin, edge breakdown is prevented even at 250–400 volts reverse-bias by the particular guard ring structure employed.

It is another feature of our APD process that the ion implantation step (4), the drive step (5), and subsequent steps involving heating are mutually adapted so that the electric field profile in the multiplication region (the p-layer) is substantially triangular. This profile provides a balance betwen the competing effects of field dependent ionization rates and mixed injection of photocarriers in the high field region to the extent that it approaches the low noise performance of pure electron injection over a broad range of diffusion depths.

It is another feature of our process for fabricating both $n^+$-p-$\pi$-$p^+$ APDs as well as $n^+$-$\pi$-$p^+$ photodiodes that dark currents are two to three orders of magnitude lower than those of the prior art primarily by virtue of the HCl gettering of step (10) and the P-gettering of step (6) in combination with the channel stop formed in step (3).

BRIEF DESCRIPTION OF THE DRAWING

These and other objects of our invention, together with its various features and advantages, can be readily understood from the following more detailed description taken in conjunction with the accompanying drawing in which.

DETAILED DESCRIPTION

$n^+$-p-$\pi$-$p^+$ APD

Figure 1:
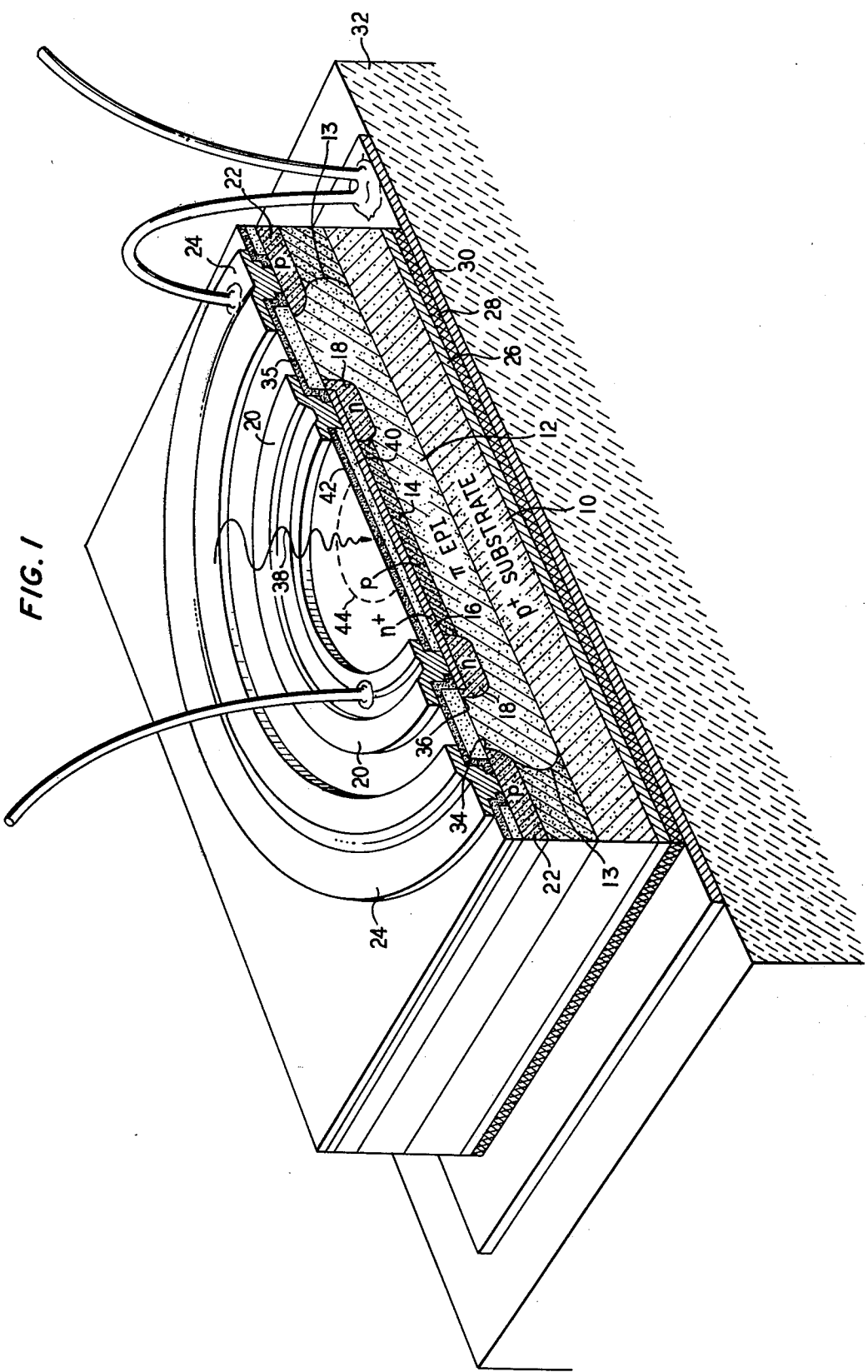
FIG. 1 is an isometric view of an $n^+$-p-$\pi$-$p^+$ silicon APD fabricated in accordance with an illustrative embodiment of our invention.

With reference now to the drawing, FIG. 1 depicts a silicon APD fabricated in accordance with one embodiment of the inventive process of our invention. The structure of the APD will be first described, then its operation and fabrication.

The APD, shown in cross section in FIG. 1, comprises a $p^+$-silicon substrate 10 on which is epitaxially grown a high resistivity $\pi$-type silicon layer 12. A p-layer 14 is formed in the top major surface of $\pi$-layer 12 and a thin $n^+$-layer 16 is formed in p-layer 14. This portion of the structure defines an elementary $n^+$-p-$\pi$-$p^+$ APD in which the p-layer is the multiplication region. In a practical device, however, the configuration is adapted to meet the requirements of the system in which the APD is to function. In particular, an n-type guard ring 18 is formed in $\pi$-layer 12 so as to surround p-layer 14 and $n^+$-layer 16. The $n^+$-layer 16 extends laterally beyond the p-layer 14 so as to overlap the guard ring which prevents edge break-down of the $n^+$-p junction under normal operating conditions. The $n^+$-layer also serves as a contact layer for an annular metal contact and field plate 20 (e.g., PtSi—Ti—Pt—Au or Al) to which the positive terminal of a bias voltage source (not shown) is connected.

In addition, a p-type channel stop 22 is formed in $\pi$-layer 12. The channel stop which surrounds, but is in spaced relation to, the guard ring 18, serves to prevent inversion layers at the surface of high resistivity $\pi$-layer 12. An annular metal contact and field plate 24 (e.g., PtSi-Ti-Pt-Au or Al) is made to the p-type channel stop 22 and thereby to the $p^+$-substrate 10. Contact to the substrate 10 is also made via a metal layer 26 (e.g., Ti—Au) formed on its bottom surface. Another metal layer 30 (e.g., Au) is formed on a ceramic mounting block 32. A conductive epoxy layer 28 or other suitable means (e.g., a solder preform) is used to bond the APD to block 32. The negative terminal of the bias voltage source is connected to metal layer 30 and optionally to channel stop field plate 24.

In order to reduce the accumulation of ions in or on the surface of dielectric layer 35 above the surface portions 34 of the p-$\pi$ metallurgical junction, the channel stop field plate 24 overlaps the junction portion 34, thereby reducing both noise and leakage current and improving reliability. For the same reason the guard ring field plate 20 overlaps the surface portion 36 of the n-$\pi$ metallurgical junction.

In order to reduce the reflection of radiation 38 to be detected, the $n^+$-*layer 16 is covered with an anti-reflection coating comprising a thin layer 40 of SiO$_2$* and a quarter wavelength thick layer 42 of Si$_3$N$_4$. These layers also serve to passivate the surface. Note that SiO$_2$ and Si$_3$N$_4$ layers are also formed between the guard ring and channel stop, but the SiO$_2$ layer there is thicker because some SiO$_2$ remained from prior processing steps to be subsequently described.

Figure 2:
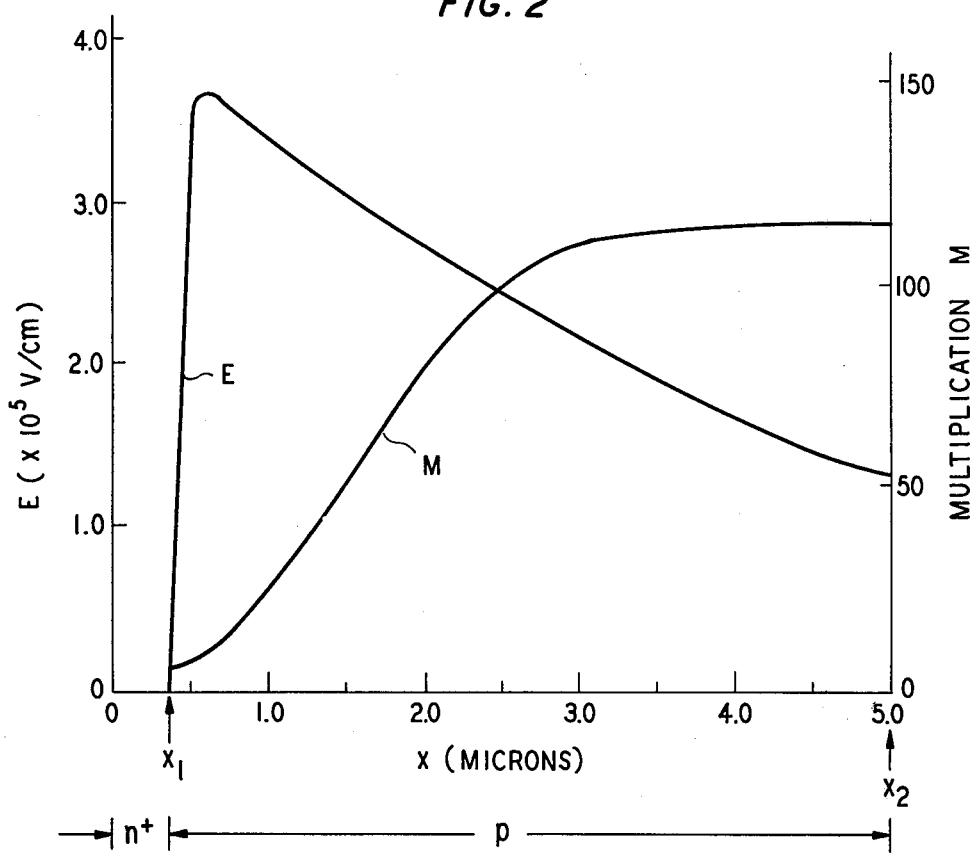
FIG. 2 is a graph of the electric field and multiplication factor profile calculated for a theoretical APD of the type shown in FIG. 1.

In operation, a reverse bias sufficiently high (typically several hundred volts) to fully deplete $\pi$-layer 12 and p-layer 14 (laterally to lines 13 and vertically to substrate 10) is applied across the contacts 20 and 30, and radiation 38 is made incident on the active area of the device, a circular zone 44 in the center of the guard ring. The radiation generates photoexcited carriers primarily in the $\pi$-layer. These carriers are multiplied in the high field p-layer 14. Electrons are collected in the $n^+$-layer 16 and holes are collected in the $p^+$-substrate 10. The resulting photocurrent flows in a load (not shown) connected across contacts 20 and 30. Because this device is front-illuminated mixed carrier injection occurs. That is, radiation incident on $n^+$-layer 16 generates holes which are injected into the p-layer where they are multiplied, and the same radiation which penetrates to the p-layer and $\pi$-layer generates electrons which are injected into the multiplication region. In order to approach the low noise performance of pure electron injection (i.e., of a back-illuminated APD), the $n^+$-layer is made very thin and the electric field profile is shaped as shown in FIG. 2. That is, the field is nearly zero in the $n^+$-layer, rises very steeply near the $n^+$-p junction and has a substantially triangular shape in the p-layer. The triangular profile produces multiplication with extremely low noise for electrons entering near the p-$\pi$ interface ($x_2$), as well as relatively low noise (compared to a rectangular field profile) for mixed hole and electron injection in the p-layer resulting from front-illumination.

Note that the thinness of the $n^+$-layer also serves to reduce optical absorption therein and thereby to support high quantum efficiency. Otherwise a substantial number of minority carriers generated in the $n^+$-layer would recombine before reaching the high field region of the p-layer.

Although the graph of FIG. 2 represents only theoretical calculations, we have been able to realize its essential characteristics in an $n^+$-p-$\pi$-$p^+$ silicon APD fabricated, in accordance with an illustrative embodiment of our invention, as follows:

(1) on a low dislocation density, p-type silicon substrate 10 doped with boron to about $5 \times 10^{17}$–$1.2 \times 10^{18}$ cm$^{-3}$, we grew a high resistivity (>300 $\Omega$-cm) epitaxial silicon layer 12 about 30 to 60 $\mu$m thick. Preferably the epitaxial layer is greater than 35 $\mu$m thick in order to collect at least 95% of the carriers photoexcited by radiation at about 0.825 $\mu$m. The epitaxial layers were grown in a reactor using dichlorosilane (SiH$_2$Cl$_2$) as the silicon source. The growth rate was illustratively 3.5 $\mu$m/min at a deposition temperature of about 1100°–1200° C. Diborane was used as a dopant source and prior to growth a 1 micron, in situ, HCl etch was performed at 1160° C. Because these high resistivity layers are grown on heavily doped substrates, care should be exercised to control autodoping from the substrate;

(2) a layer of SiO$_2$ was then formed on the epitaxial layer by oxidation of the silicon in a moist O$_2$ ambient at, for example, 1050° C. for 2 hrs. Using standard photolithographic techniques an opening was made in the oxide to allow formation of guard ring 18;

(3) phosphorus was then diffused into the opening by predepositing a phosphorus glass layer therein from a POCl$_3$ source at 900°–950° C. for 15–30 min. The phosphorus glass layer was removed, and the phosphorus was diffused into the underlying portions of epitaxial layer 12 by heating at 1100°–1200° C. for 30–60 min. (not critical) in an atmosphere of N$_2$ + 0.1% O$_2$. In order to reduce the number of crystalline defects created in the layers, the intermediate device structures (wafers) were placed in a furnace idling at a temperature of about 900° C., and then the temperature was gradually increased (e.g., at 4°-8° C./min) to 1100°-1200° C. For the same reason the temperature was ramped down to 900° C. after diffusion took place for the prescribed time. This diffusion step formed the n-type guard ring 18;

(4) oxidation and masking step (2) was repeated to form an opening for the channel stop;

(5) boron was then diffused into the opening by predepositing a boron glass layer therein from a BN source at 950°-975° C. for 1-2 hrs. The boron glass layer was removed and the boron was then diffused into the underlying portions of epitaxial layer 12 by heating at 1100°-1200° C. for 30-60 min. (not critical) in an atmosphere of essentially 100% $O_2$. For the same reason described in step (3) the furance temperature was ramped between 900° C. and the drive-in temperature. This diffusion step formed the p-type channel stop 22;

(6) oxidation and masking step (2) was again repeated to form an opening closed by and partially overlapping guard ring 18. Boron ions were then implanted into the top surface of epitaxial layer 12. The energy and dose were 30-150 keV 4-6 × $10^{12}$ cm$^{-2}$, respectively. Controlling the dose to within ±5% for a given device design was particularly important. If the dose was too high, for example, the entire heating cycle (i.e., time and temperature of all subsequent steps involving heating) would have to be modified to longer times and/or higher temperatures, if possible. Conversely, if the initial dose were too low, the device would have a very small gain and high breakdown voltage;

(7) after implantation, the boron ions were driven into the epitaxial layer by heating at about 1150°-1250° C. for 2-8 hrs. in an atmosphere of 0.1-1.0% $O_2$ in nitrogen or argon. At 1200° C. for 4 hrs., for example, this step formed a p-layer 14 (the multiplication region) about 6 μm thick. However, this layer is 2-12 μm thick for the processing ranges given although 5-7 μm is preferred for an APD having $M = 100$ at 300 V. As in steps (3) and (5) the furance temperature was ramped between 900° C. and the drive-in temperature;

(8) next, the entire wafer was re-oxidized at about 1050° C. for 1 hr. The oxide was stripped only from the backside of the substrate 10;

(9) using a $POCl_3$ source, a phosphorus glass layer was then formed on the backside of the substrate 10. Other phosphorus sources, such as $PBr_3$, are also suitable for this predeposition as well as for previous phosphorus predepositions. Phosphorus was diffused into the backside by heating at about 1000°-1100° C. for 30-60 min in an atmosphere of substantially $N_2 + 0.1\%$ $O_2$. Strain and/or misfit dislocations caused by the phosphorus atoms was effective in gettering impurities (especially fast-diffusing metallic impurities) and other defect nucleation sites. This step played a significant role in reducing dark currents in our APDs. As in steps (3) and (5) the furance temperature was ramped between 900° C. and the diffusion temperature;

(10) next, the phosphorus glass layer on the backside was removed and the wafer was re-oxidized at about 900° C. for 10 min. Using standard photolithographic techniques the oxide was masked and an opening was formed for the n+-layer 16;

(11) the n+-layer 16 was formed by a phosphorus predeposition (i.e., deposition of a phosphorus glass layer from $POCl_3$) followed by heating at about 920°-930° C. for 20-30 min. in an atmosphere of substantially $N_2 + 0.1\%$ $O_2$. The glass layer was then removed. This step resulted in an n+-layer about 0.3 μm thick. Subsequent heating steps increased the thickness to about 0.4 μm, the preferred value, although a range of 0.1-1.0 μm is suitable. Alternatively, the n+-layer can be formed from an arsenic predeposition or by arsenic ion implantation and drive-in. This step compensates the previously implanted boron and thereby determines the depth of the p-n+ junction. The time and temperature are critical in that deeper diffusions reduce the total charge in the p-layer and increase the breakdown voltage. In addition, this step in conjunction with the implant-drive steps (6) and (7) establishes the desired triangular electric field profile.

(12) at this intermediate stage the devices were tested to measure their current-voltage characteristics and leakage currents. Those diodes which met specification were subjected to subsequent processing. Those which did not, but which were overdoped in the critical p-layer 14, were heated in an effort to bring them to specification. Testing and reheating can be repeated until the device meets specification.

(13) those device which met specification were coated with a thin layer 40 (about 100-200 angstroms) of $SiO_2$ by a well-known dry oxidation process;

(14) then, the $SiO_2$ layer was subjected to an anneal at about 850°-905° C. for 10-30 min. in an atmosphere of about 1-5% HCl in $N_2$. This step is important for reducing leakage current because it effectively getters or traps mobile ions such as Na ions in the oxide;

(15) after gettering, a quarter wavelength layer 42 of $Si_3N_4$ (about 1000 angstroms for λ as measured in the material) was deposited on $SiO_2$ layer 40 using a chemical vapor deposition process; layers 40 and 42 served to passivate the device from external contamination and, in the active region enclosed by guard ring 18, served as an anti-reflection coating;

(16) next, contact windows were opened in layers 40 and 42 for field plates 20 and 24;

(17) the substrate (initially about 500 μm thick) was then etched or lapped on the backside to remove about 75 μm of material and thereby remove the phosphorus layer created by prior diffusion steps (e.g., gettering step (9)). In order to reduce contact resistance, boron ions were implanted in the backside at about 30-50 keV to a dose of 2-4 × $10^{15}$ cm$^{-2}$. The boron ions were then activated by heating in an $N_2$ atmosphere at about 750°-800° C. for 30-60 min.

(18) using suitable masking, metal was deposited to form the guard ring and channel stop field plates 20 and 24 from a PtSi—Ti—Pt—Au metallization. In order to avoid ion accumulation at the surface portions 34 and 36 of the π-p and π-n junctions, these field plates were made to overlap the respective metallurgical junctions. Because the oxide-nitride layers are thin over these regions and because high reverse bias voltages are applied, impulse noise due to surface microplasmas and/or leakage current would result without this overlapping configuration;

(19) the device was then annealed at 300°-320° C. in an atmosphere of $N_2 + 8\text{-}15\%$ $H_2$ for about 16-24 hrs. in order to reduce surface state density and anneal the Au in the contact layers to improve bondability;

(20) finally, Ti—Au alloy layer 26 was deposited on substrate 10. Using a conductive epoxy layer 28 the APD was bonded to Au layer 30 on ceramic mounting block 32.

Using the foregoing procedure, we fabricated $n^+$-p-$\pi$-$p^+$ silicon APDs in which, for example: the $p^+$-substrate 10 was 500 μm thick; the epitaxial $\pi$-layer 12 was 50 μm thick and had a resistivity of greater than 300 Ω-cm; the ion-implanted p-layer 14 was about 6 μm thick and had a substantially triangular electric field profile; and the $n^+$-layer was about 0.4 μm thick. The diameter of the active zone was about 100 μm, the inside and outside diameters of the guard ring were 180 μm and 290 μm, respectively, and those of the channel stop were 350 μm and 460 μm, respectively.

Radiation from a double heterostructure GaAs—AlGaAs junction laser operating c.w. at room temperature ($\lambda$ = 0.825 μm) was coupled through an optical fiber to the active region of the APD.

This APD operated between full depletion of p-layer 14 and $\pi$-layer 12 at 100V and breakdown at 375V. Over this voltage range current gains of five to several hundred were attained. At a gain of 100 the excess noise factor was only 4 to 6 over the shot noise limit. The total dark current was only about $10^{-11}$ A and that portion which is eventually multiplied was about $10^{-13}$ A. The quantum efficiency exceeded 95% and the responce speed was about 1 ns. When incorporated into an optical receiver, sensitivity at 0.825 μm and 44.7 megabit/sec was −55 dBm. From a reliability standpoint, the mean time to failure was approximately $10^3$-$10^4$ hours based on bias stress aging tests at 200° C.

The specific values for the more important parameters used to fabricate the immediately above APD were as follows:

in step (3), phosphorus was diffused at 1200° C. for 1 hr.;

in step (5), boron was diffused at 1150° C. for 1 hr.;

in step (6), boron ions were implanted at an energy of 150 keV to a dose of 5.5 × $10^{12}$ cm$^{-2}$ ± 5%;

in step (7), the boron ions were driven in at 1200° C. for 4 hrs.;

in step (9), the phosphorus glass layer on the backside was heated at 1100° C. for 1 hr.;

in step (11), phosphorus glass layer on the p-layer was heated at 925° C. for 30 min.; and in step (14), the SiO$_2$ layer was annealed at 900° C. for 10 min. in N$_2$ + 5% HCl.

$n^+$-$\pi$-$p^+$ Photodiode

We have found that the foregoing APD fabrication process, excluding the ion implantation and drive-in steps, is also an effective way to make $n^+$-$\pi$-$p^+$ silicon photodiodes having high quantum efficiency (>90% at GaAs—AlGaAs wavelengths), short response times (e.g., 1 ns at 100V or 4 ns at 5V), low dark current (e.g., $10^{-11}$ A), low capacitance (e.g., 1.5 pf at 10V) and good reliability (e.g., mean time to failure >>$10^4$ hours). This kind of detector is particularly useful in systems where gain in the photodiode is not essential—for example, low data rate, short distance, LED optical systems.

Figure 3:
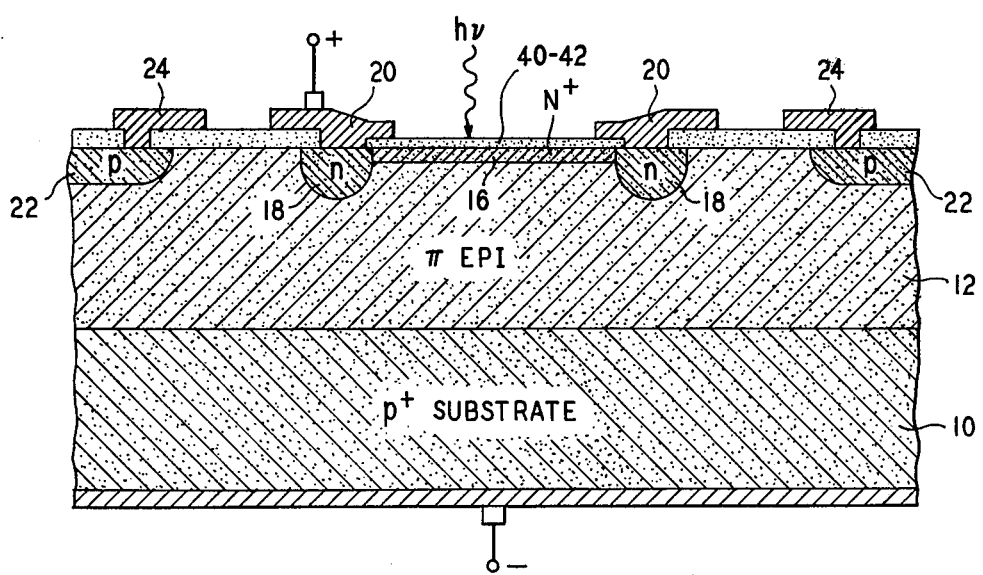
FIG. 3 is a cross-sectional view of an $n^+$-$\pi$-$p^+$ silicon photodiode fabricated in accordance with another embodiment of our invention.

Reference will be made to FIG. 3 where components corresponding to those of FIG. 1 have been given identical numerals to facilitate comparison. Thus, the process illustratively comprises the steps of: (1) epitaxially growing a high resistivity (>300 Ω-cm) $\pi$-type silicon layer 12 about 30-60 μm thick on a high conductivity $p^+$-type silicon substrate 10; (2) forming an n-type guard ring 18 in the $\pi$-layer 12 by a predeposition and diffusion of phosphorus; (3) forming a p-type channel stop 22 around the guard ring 18 by a predeposition and diffusion of boron; (4) introducing phosphorus into the backside of $p^+$-substrate 10 from a POCl$_3$ or other suitable source by heating at about 1000°-1100° C. for 30-60 min., thereby to getter defects and/or impurities; (5) ramping the furance temperature during steps (2), (3) and (4) to reduce crystalline defects; (6) forming in the $\pi$-layer 12 a thin $n^+$-layer 16 about 0.1-1.0 μm thick; (7) forming an antireflection coating and passivation coating 40-42 comprising a thin layer of SiO$_2$ on the $n^+$-layer 16 and a quarter wavelength thick layer of Si$_3$N$_4$ on the SiO$_2$; (8) after forming the SiO$_2$ but before forming the Si$_3$N$_4$, annealing at about 850°-950° C. for 10-30 min. in 1-5% HCl, thereby to getter or trap mobile ion contamination in the SiO$_2$; (9) forming a high conductivity $p^{++}$-contact layer (not shown) to the back of the $p^+$-substrate 10; and (10) forming electrical contacts to the substrate 10, the guard ring 18 and the channel stop 22 so that the guard ring contact 20 overlaps the surface portion of the $\pi$-n metallurgical junction and the channel stop contact 24 overlaps the surface portion of the $\pi$-p metallurgical junction.

In practice each of the above process steps duplicated in detail the corresponding step in the APD fabrication process with one exception. That is, the guard ring phosphorus drive-in for the APD took place at 1100°-1200° C. for 30-60 min., whereas the corresponding step for the p-i-n photodiode is preferably done at a temperature at the high end of that range (e.g., 1200° C.) for a longer time period (e.g., 120 min.) in order to produce the desired diffusion profile in the device. More specifically, shorter heating times and lower temperatures are suitable in APD guard ring formation because the APD process includes an additional thermal cycle —the ion implantation drive-in step—which itself causes some diffusion of priorly incorporated impurity atoms.

Finally, while it is preferable from the standpoint of device performance to utilize all of the process steps involving furance temperature ramping, backside phosphorus gettering, HCl gettering, channel stop, guard ring and field plate formation, and electric field profiling (in the case of an APD), selected subcombinations of these steps also produce good albeit not optimum devices or optimum yields.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, our process is also suitable for fabricating silicon photodiodes for detection of radiation of wavelength in the range of 0.5 to 1.0 μm. At either end of this range there may be some sacrifice of quantum efficiency and/or excess noise factor. Thus, for example, it should be noted that in a clean furnace which provides an essentially Na-free environment, the HCl gettering step is optional and may be omitted. Second, it is obvious to one skilled in the art that the sequence of forming the channel stop and guard ring can be interchanged. Third, inasmuch the guard ring and field plate structures both serve to reduce the electric field at the silicon epi-surface, it is possible to build good devices without guard rings. However, including guard rings is preferred for two reasons: (i) facilitating metallization in both types of devices; that is, since the $n^+$-layer is very thin, the metal contact thereto could diffuse or alloy through to the $n^+$-$\pi$ junction and thereby degrade device performance, and (ii) avoiding pressure to the APD gain region; that is, because the gain-voltage characteristic of an APD is pressure sensitive, placing metallization over the guard rings, rather than on the n+-layer, means that operations such as bonding leads, and test probing will not affect the APD characteristic.

What is claimed is:

1. A method of fabricating a front-illuminated silicon photodiode comprising the steps of:
    (a) epitaxially growing a high resistivity $\pi$-type silicon layer on a low dislocation density, high conductivity p-type silicon substrate;
    (b) forming an n-type guard ring in the $\pi$-layer by phosphorus diffusion;
    (c) forming in the $\pi$-layer a p-type channel stop around the guard ring by boron diffusion;
    (d) ramping the diffusion temperature during steps (b) and (c) to reduce crystalline defects;
    (e) forming an n+-layer in the $\pi$-layer;
    (f) forming an antireflection coating on at least the n+-layer and a passivation coating on the region between the guard ring and channel stop;
    (g) forming electrical contacts to the substrate, the guard ring and the channel stop so that the guard ring contact overlaps the surface portion of the $\pi$-n metallurgical junction and the channel stop contact overlaps the surface portion of the $\pi$-p metallurgical junction.

2. A method of fabricating a front-illuminated silicon photodiode comprising the steps of:
    (a) epitaxially growing a high resistivity $\pi$-type silicon layer on a low dislocation density, high conductivity p-type silicon substrate;
    (b) forming an n-type guard ring in the $\pi$-layer by phosphorus diffusion;
    (c) forming in the $\pi$-layer a p-type channel stop around the guard ring by boron diffusion;
    (d) introducing phosphorus into the backside of the substrate effective to getter defects and/or impurities;
    (e) forming an n+-layer in the $\pi$-layer;
    (f) forming an antireflection coating on at least the n+-layer and a passivation coating on the region between the guard ring and channel stop; and
    (g) forming electrical contacts to the substrate, the guard ring and the channel stop so that the guard ring contact overlaps the surface portion of the $\pi$-n metallurgical junction and the channel stop contact overlaps the surface portion of the $\pi$-p metallurgical junction.

3. A method of fabricating a front-illuminated silicon photodiode comprising the steps of:
    (a) epitaxially growing a high resistivity $\pi$-type silicon layer on a low dislocation density, high conductivity p-type silicon substrate;
    (b) forming an n-type guard ring in the $\pi$-layer by phosphorous diffusion;
    (c) forming in the $\pi$-layer a p-type channel stop around the guard ring by boron diffusion;
    (d) introducing phosphorus into the backside of the substrate effective to getter defects and/or impurities;
    (e) ramping the diffusion temperature during steps (b), (c) and (d) to reduce crystalline defects;
    (f) forming an n+-layer in the $\pi$-layer
    (g) forming an antireflection coating on at least the n+-layer and a passivation coating on the region between the guard ring and channel stop; and
    (h) forming electrical contacts to the substrate, the guard ring and the channel stop.

4. A method of fabricating a front-illuminated silicon photodiode comprising the steps of:
    (a) epitaxially growing a high resistivity $\pi$-type silicon layer on a low dislocation density, high conductivity p-type silicon substrate;
    (b) forming in the $\pi$-layer a p-type channel stop by boron diffusion;
    (c) introducing phosphorus into the backside of the substrate effective to getter defects and/or impurities;
    (d) ramping the diffusion temperature during steps (b) and (c) to reduce crystalline defects;
    (e) forming an n+-layer in the $\pi$-layer;
    (f) forming an antireflection coating on at least the n+-layer;
    (g) forming electrical contact to the substrate, the n+-layer and the channel stop so that the channel stop contact overlaps the surface portion of the $\pi$-p metallurgical junction an the n+-layer contact overlaps the surface portion of the $\pi$-n+ metallurgical junction.

5. A method of fabricating a front-illuminated silicon photodiode comprising the steps of:
    (a) epitaxially growing a high resistivity $\pi$-type silicon layer on a low dislocation density, high conductivity p-type silicon substrate;
    (b) forming an n-type guard ring in the $\pi$-layer by phosphorus diffusion;
    (c) forming in the $\pi$-layer a p-type channel stop around the guard ring by boron diffusion;
    (d) introducing phosphorus into the backside of the substrate effective to getter defects and/or impurities;
    (e) ramping the diffusion temperature during steps (b), (c) and (d) to reduce crystalline defects;
    (f) forming an n+-layer in the $\pi$-layer;
    (g) forming an antireflection coating on at least the n+-layer and a passivation coating on the region between the guard ring and channel stop by the steps of:
        (1) forming a thin layer of $SiO_2$;
        (2) annealing the $SiO_2$ layer at an elevated temperature in an atmosphere containing HCl;
        (3) forming an $Si_3N_4$ layer about onequarter wavelength thick on the $SiO_2$ layer; and
    (h) forming electrical contacts to the substrate, the guard ring and the channel stop so that the guard ring contact overlaps the surface portion of the $\pi$-n metallurgical junction and the channel stop contact overlaps the surface portion of the $\pi$-p metallurgical junction.

6. A method of fabricating a front-illuminated $n^{30}$-p-$\pi$-p+ silicon avalanche photodiode comprising the steps of:
    (a) epitaxially growing a high resistivity $\pi$-type silicon layer on a low dislocation density, high conductivity p-type silicon substrate;
    (b) forming an n-type guard ring the $\pi$-layer by phosphorus diffusion;
    (c) forming in the $\pi$-layer a p-type channel stop around the guard ring by boron diffusion;
    (d) implanting boron ions in a surface portion of the $\pi$-layer within the guard ring;

(e) driving in the implanted boron ions by heating to form a p-layer;

(f) introducing phosphorus into the backside of the substrate effective to getter defects and/or impurities;

(g) ramping the diffusion temperature during steps (b), (c), (e), and (f) to reduce crystalline defects;

(h) forming an $n^+$-layer in the p-layer;

(i) forming an antireflection coating on at least the $n^+$-layer and a passivation coating on the region between the guard ring and channel stop by the steps of (1) forming a thin layer of $SiO_2$;

(2) annealing the $SiO_2$ layer at an elevated temperature in an atmosphere containing HCl;

(3) forming an $Si_3N_4$ layer about onequarter wavelength thick on the $SiO_2$ layer;

(j) forming electrical contacts to the substrate, the guard ring and the channel stop so that the guard ring contact overlaps the surface portion of the $\pi$-n metallurgical junction and the channel stop contact overlaps the surface portion of the $\pi$-p metallurgical junction; and (k) mutually adapting the implanting step (d), the driving step (e) and the forming step (h) in combination with subsequent steps which involve heating so that the resultant electric field profile in the p-layer is substantially triangular and of the desired magnitude.

7. The method of claim 6 for fabricating a diode suitable for detecting radiation at a wavelength of about 0.8 μm to 0.9 μm wherein:

in step (a) the epitaxial layer is grown to a thickness of at least 30 μm and with a resistivity of at least 300 Ω-cm;

in step (e) the boron ions are driven in to form a p-layer about 2–12 μm thick; and in step (h) the $n^+$-layer is formed to have a thickness of about 0.1–1.0 μm.

8. The method of claim 7 wherein:

in step (d) 30–150 keV boron ions are implanted at a dose of about 4–6 × $10^{12}$ cm$^{-2}$, and in step (e) the boron ions are driven in by heating at about 1150°–1250° C. for 2–8 hours in an atmosphere of essentially $N_2$ + 0.1–1.0% $O_2$.

9. The method of claim 8 wherein:

in step (g) the temperature is ramped between the diffusion temperature and a lower but elevated temperature;

in step (f) phosphorus is introduced by depositing a phosphorus glass layer and heating at about 1000°–1100° C. for 30–60 minutes;

in step (i) (2) the $SiO_2$ layer is annealed at about 850°–950° C. for 10–30 minutes in an atmosphere containing about 1–5% HCl.

10. The method of claim 9 wherein:

in step (f) the phosphorus glass layer is deposited from a $POCl_3$ source.

11. The method of claim 9 wherein:

in step (b) the guard ring is formed by first depositing a phosphorus glass layer at about 900°–950° C. for 15–30 min., removing the glass layer, and then, heating a furnace to the lower elevated temperature of about 900° C., inserting the intermediate device structure into the furnace containing an atmosphere of substantially $N_2$ + 0.1% $O_2$, gradually increasing the temperature to about 1100°–1200° C., maintaining the temperature constant for about 30–60 min. to effect the desired diffusion of phosphorus, gradually decreasing the temperature back to about 900° C., removing the structure from the furnace, in step (c) the channel stop is formed by first depositing a boron glass layer at about 950°–975° C. for 1–2 hrs., removing the glass layer, and then heating a furnace to the lower elevated temperature of about 900° C., inserting the intermediate device structure into the furnace containing an atomsphere of essentially 100% $O_2$, gradually increasing the temperature to about 1100°–1200° C., maintaining the temperature constant for about 30–60 min. to effect the desired diffusion of boron, gradually decreasing the temperature back to about 900° C., removing the structure from the furnace, in step (e) the furnace temperature is ramped between about 900° C., and the boron ion drive-in temperature as in the procedure of steps (b) and/or (c); and in step (f) the furnace temperature is ramped between about 900° C. and the heating temperature for introducing phosphorus as in the procedure of steps (b) and/or (c).

12. The method of claim 6 wherein:

in step (j) forming an electrical contact to the substrate includes the steps of:

(1) removing enough of the backside of the substrate so as to remove the phosphorus doped layer formed in prior steps, (2) implanting boron ions in the backside at an energy of about 30–50 keV to a dose of about 2–4 × $10^{15}$ cm$^{-2}$, and (3) heating in a nitrogen atmosphere at about 750°–800° C. for 30–60 min.

13. The method of claim 6 including, after step (j), the additional step of annealing at about 300°–320° C. for 16–24 hrs. in an atmosphere of substantially $N_2$ + 8–15% $H_2$.

14. A method of fabricating a front-illuminated $n^+$-p-$\pi$-$p^+$ silicon avalanche photodiode suitable for detecting radiation in the range of about 0.8 to 0.85 μm with quantum efficiency of at least 95%, response speed of at least 1 ns, dark current of about $10^{-11}$ A, gain of at least 100 with an excess noise factor of less than 6 at reverse bias of at least 100V, comprising the steps of:

(a) epitaxially growing a $\pi$-type silicon layer of at least 300 Ω-cm resistivity and at least 35 μm thick on a low dislocation density, p-type silicon substrate doped with boron to about 5 × $10^{17}$–1.2 × $10^{18}$ cm$^{-3}$;

(b) forming an n-type guard ring in the $\pi$-layer be depositing a phosphorus glass layer at about 900°–950° C. for 15–30 min., removing the glass layer, heating a furnace to about 900° C., inserting the wafer (substrate) into the furnace, gradually increasing the temperature to about 1200° C., maintaining the temperature constant for about 1 hr. in an atmosphere of substantially $N_2$ + 0.1% $O_2$, gradually decreasing the temperature back to about 900° C., and removing the wafer from the furnace, (c) forming in the $\pi$-layer a p-type channel top around the guard ring by depositing a boron glass layer at about 950°–975° C. for 1–2 hrs., removing the glass layer, heating a furnace to about 900° C., inserting the wafer into the furnace, gradually increasing the temperature to about 1150° C., maintaining the temperature constant for about 1 hr. in an atmosphere of essentially 100% $O_2$, and gradually decreasing the temperature back to about 900° C., and removing the wafer from the furnace, (d) implanting 150 keV boron ions at a dose of about $5.5 \times 10^{12}$ cm$^{-2}$ ±5% into the surface portion of the $\pi$-layer within the guard ring;

(e) driving in the implanted boron ions by heating at about 1200° C. for 4 hrs. in an atmosphere of essentially 100% O$_2$, thereby to form a p-layer about 5-7 μm thick and ramping the temperature between about 900° C. and 1200° C. as in the procedure of steps (b) and/or (c);

(f) introducing phosphorus into the backside of the substrate by forming thereon a phosphorus glass layer and heating for about 1100° C. for 1 hr. in an atmosphere of substantially N$_2$ + 0.1% O$_2$, thereby to getter defects and/or impurities, and then removing the glass layer, and ramping the temperature between about 900° C. and 1100° C. as in the procedure of steps (b) and/or (c);

(g) forming an n$^+$-layer about 0.4 μm thick in the p-layer so that it extends laterally beyond the p-layer and into the guard ring by depositing a phosphorus glass layer and heating at about 925° C. for 30 min. in an atmoshpere of substantially N$_2$ + 0.1% O$_2$;

(h) forming an antireflection coating on at least the n$^{20}$-layer and a passivation coating on the region between the guard ring and channel stop by the steps of:
  (1) forming a thin layer of SiO$_2$ by a dry oxidation process;
  (2) annealing the SiO$_2$ layer at about 900° C. for 10 min. in an atmosphere containing about 5% HCl, thereby to trap or getter Na ions in the oxide; and
  (3) forming an Si$_3$N$_4$ layer about onequarter wavelength thick on the SiO$_2$ layer;

(i) removing enough of the backside of the substrate so as to remove the phosphorus doped layer formed in prior steps, implanting boron ions in the backside at an energy of about 30-50 keV to a dose of about $2-4 \times 10^{15}$ cm$^{-2}$, and heating in a nitrogen atmosphere at about 750°-800° C. for 30-60 min.;

(j) forming electrical contacts to the substrate, the guard ring and the channel stop so that the guard ring contact overlaps the surface portion of the $\pi$-n metallurgical junction and the channel stop contact overlaps the surface portion of the $\pi$-p metallurgical junction; and (k) annealing at about 300°-320° C. for 16-24 hrs. in an atmosphere of substantially N$_2$ + 8-15% H$_2$;

(l) mutually adapting the implanting step (d), the driving step (e), and the forming step (g) in combination with subsequent steps which involve heating so that the resultant electric field profile in the p-layer is substantially triangular and of the desired magnitude.

15. A method of fabricating a front-illuminated N$^+$-P-$\pi$-p$^+$ silicon avalanche photodiode comprising the steps of:

(a) epitaxially growing a high resistivity $\pi$-type silicon layer on a low dislocation density, high conductivity p-type silicon substrate;

(b) forming an n-type guard ring in the $\pi$-layer by phosphorus diffusion;

(c) forming in the $\pi$-layer a p-type channel stop around the guard ring by boron diffusion;

(d) implanting boron ions in a surface portion of the $\pi$-layer within the guard ring;

(e) driving in the implanted boron ions by heating to form a p-layer;

(f) introducing phosphorus into the backside of the substrate effective to getter defects and/or impurities;

(g) ramping the diffusion temperature during steps (b), (c), (e), and (f) to reduce crystalline defects;

(h) forming an n$^+$-layer in the p-layer;

(i) forming an antireflection coating on at least the n$^+$-layer and a passivation coating on the region between the guard ring and channel stop;

(j) forming electrical contacts to the substrate, the guard ring and the channel stop so that the guard ring contact overlaps the surface portion of the $\pi$-n metallurgical junction and the channel stop contact overlaps the surface portion of the $\pi$-p metallurgical junction; and (k) mutually adapting the implanting step (d), the driving step (e) and the forming step (h) in combination with subsequent steps which involve heating so that the resultant electric field profile in the p-layer is substantially triangular and of the desired magnitude.

16. A method of fabricating a front-illuminated n$^+$-p-$\pi$-p$^+$ silicon avalanche photodiode comprising the steps of:

(a) epitaxially growing a high resistivity $\pi$-type silicon layer on a low dislocation density, high conductivity p-type silicon substrate;

(b) forming an n-type guard ring in the $\pi$-layer by phosphorus diffusion;

(c) forming in the $\pi$-layer a p-type channel stop around the guard ring by boron diffusion;

(d) implanting boron ions in a surface portion of the $\pi$-layer within the guard ring;

(e) driving in the implanted boron ions by heating to form a p-layer;

(f) ramping the diffusion temperature during steps (b), (c), and (e) to reduce crystalline defects;

(g) forming an n$^+$-layer in the p-layer;

(h) forming an antireflection coating on at least the n$^+$-layer and a passivation coating on the region between the guard ring and channel stop;

(i) forming electrical contacts to the substrate, the guard ring and the channel stop so that the guard ring contact overlaps the surface portion of the $\pi$-n metallurgical junction and the channel stop contact overlaps the surface portion of the $\pi$-p metallurgical junction; and (j) mutually adapting the implanting step (d), the driving step (e) and the forming step (g) in combination with subsequent steps which involve heating so that the resultant electric field profile in the p-layer is substantially triangular and of the desired magnitude.

17. A method of fabricating a front-illuminated n$^+$-p-$\pi$-p$^+$ silicon avalanche photodiode comprising the steps of:

(a) epitaxially growing a high resistivity $\pi$-type silicon layer on a low dislocation density, high conductivity p-type silicon substrate;

(b) forming an n-type guard ring in the $\pi$-layer by phosphorus diffusion;

(c) forming in the $\pi$-layer a p-type channel stop around the guard ring by boron diffusion;

(d) implanting boron ions in a surface portion of the π-layer within the guard ring;

(e) driving in the implanted boron ions by heating to form a p-layer;

(f) introducing phosphorus into the backside of the substrate effective to getter defects and/or impurities;

(g) forming an n+-layer in the p-layer;

(h) forming an antireflection coating on at least the n+-layer and a passivation coating on the region between the guard ring and channel stop;

(i) forming electrical contacts to the substrate, the guard ring and the channel stop so that the guard ring contact overlaps the surface portion of the π-n metallurgical junction and the channel stop contact overlaps the surface portion of the π-p metallurgical junction; and (j) mutually adapting the implanting step (d), the driving step (e) and the forming step (g) in combination with subsequent steps which involve heating so that the resultant electric field profile in the p-layer is substantially triangular and of the desired magnitude.

18. A method of fabricating a front-illuminated n+-n-π-p+ silicon avalanche photodiode comprising the steps of:

(a) epitaxially growing a high resistivity π-type silicon layer on a low dislocation density, high conductivity p-type silicon substrate;

(b) forming an n-type guard ring in the π-layer by phosphorus diffusion;

(c) forming in the π-layer a p-type channel stop around the guard ring by boron diffusion;

(d) implanting boron ions in a surface portion of the π-layer within the guard ring;

(e) driving in the implanted boron ions by heating to form a p-layer;

(f) introducing phosphorus into the backside of the substrate effective to getter defects and/or impurities;

(g) ramping the diffusion temperature during steps (b), (c), (e), and (f) to reduce crystalline defects;

(h) forming an n+-layer in the p-layer;

(i) forming an antireflection coating on at least the n+-layer and a passivation coating on the region between the guard ring and channel stop;

(j) forming electrical contacts to the substrate, the guard ring and the channel stop; and (k) mutually adapting the implanting step (d), the driving step (e) and the forming step (h) in combination with subsequent steps which involve heating so that the resultant electric field profile in the p-layer is substantially triangular and of the desired magnitude.

19. A method of fabricating a front-illuminated n+-p-π-p+ silicon avalanche photodiode comprising the steps of:

(a) epitaxially growing a high resistivity π-type silicon layer on a low dislocation density, high conductivity p-type silicon substrate;

(b) forming an n-type guard ring in the π-layer by phosphorus diffusion;

(c) forming in the π-layer a p-type channel stop around the guard ring by boron diffusion;

(d) implanting boron ions in a surface portion of the π-layer within the guard ring;

(e) driving in the implanted boron ions by heating to form a p-layer;

(f) introducing phosphorus into the backside of the substrate effective to getter defects and/or impurities;

(g) ramping the diffusion temperature during steps (b), (c), (e), and (f) to reduce crystalline defects;

(h) forming an n+-layer in the p-layer;

(i) forming an antireflection coating on at least the n+-layer and a passivation coating on the region between the guard ring and channel stop; and (j) forming electrical contacts to the substrate, the guard ring and the channel stop so that the guard ring contact overlaps the surface portion of the π-n metallurgical junction and the channel stop contact overlaps the surface portion of the π-p metallurgical junction.

20. A method of fabricating a front-illuminated n+-p-π-p+ silicon avalanche photodiode comprising the steps of:

(a) epitaxially growing a high resistivity π-type silicon layer on a low dislocation density, high conductivity p-type silicon substrate;

(b) forming in the π-layer a p-type channel stop by boron diffusion; the channel stop surrounding the active area of the photodiode;

(c) implanting boron ions in a surface portion of the π-layer within the active area;

(d) driving in the implanted boron ions by heating to form a p-layer;

(e) introducing phosphorus into the backside of th substrate effective to getter defects and/or impurities;

(f) ramping the diffusion temperature during steps (b), (d) and (e) to reduce crystalline defects;

(g) forming an n+-layer in the p-layer;

(h) forming an antireflection coating on at least the n+-layer;

(i) forming electrical contacts to the substrate, the n+-layer and the channel stop so that the channel stop contact overlaps the surface portion of the π-p metallurgical junction and the n+-layer contact overlaps the surface portion of the π-n+ metallurgical junction; and (j) mutually adapting the implanting step (c) and the driving step (d) and the forming step (h) in combination with subsequent steps which involve heating so that the resultant electric field profile in the p-layer is substantially triangular and of the desired magnitude.

* * * * *

UNITED STATES PATENT AND TRADEMARK OFFICE
CERTIFICATE OF CORRECTION

PATENT NO. : 4,127,932

DATED : December 5, 1978

INVENTOR(S) : Adrian R. Hartman, Hans Melchior, David P. Schinke and Richard G. Smith It is certified that error appears in the above–identified patent and that said Letters Patent are hereby corrected as shown below:

Column 3, line 18, "p$\pi$" should be --p-$\pi$--. Column 7, line 59, "furance" should be --furnace--. Column 8, line 28, "905" should be --950--. Column 10, line 4, "furance" should be --furnace--; line 38, "furance" should be --furnace--. Column 12, line 57, "$n^{30}$" should be --$n^+$--. Column 14, line 51, "be" should be --by--. Column 15, line 27, "$n^{20}$" should be --$n^+$--; lines 59 and 60, "$N^+$-P" should be --$n^+$-p--. Column 17, line 25, "$n^+$-n-" should be --$n^+$-p---. Column 18, line 40, "th" should be --the--.

Signed and Sealed this

Twenty-fourth Day of July 1979

[SEAL]

Attest:

Attesting Officer

LUTRELLE F. PARKER
Acting Commissioner of Patents and Trademarks